United States Patent
Kim et al.

(10) Patent No.: US 12,501,809 B2
(45) Date of Patent: Dec. 16, 2025

(54) DISPLAY DEVICE HAVING COLOR FILTERS AND PARTITION AND METHOD FOR MANUFACTURING THE SAME

(71) Applicant: Samsung Display Co., LTD., Yongin-si (KR)

(72) Inventors: Hyun-Seok Kim, Hwaseong-si (KR); Eunjung Kim, Suwon-si (KR); Hyo Joon Kim, Seoul (KR); Seon-Tae Yoon, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 501 days.

(21) Appl. No.: 17/887,026

(22) Filed: Aug. 12, 2022

(65) Prior Publication Data
US 2023/0200175 A1 Jun. 22, 2023

(30) Foreign Application Priority Data
Dec. 16, 2021 (KR) .......... 10-2021-0180602

(51) Int. Cl.
*H10K 59/38* (2023.01)
*H10K 50/858* (2023.01)
*H10K 59/12* (2023.01)
*H10K 71/00* (2023.01)

(52) U.S. Cl.
CPC .......... *H10K 59/38* (2023.02); *H10K 50/858* (2023.02); *H10K 59/12* (2023.02); *H10K 71/00* (2023.02); *H10K 59/1201* (2023.02)

(58) Field of Classification Search
CPC .... H10K 50/858; H10K 59/38; H10K 59/879; H10K 50/841; H10K 59/873; H10K 50/844
See application file for complete search history.

(56) References Cited

U.S. PATENT DOCUMENTS

| | | | |
|---|---|---|---|
| 10,048,412 B2 | 8/2018 | Li | |
| 10,459,336 B2 | 10/2019 | Qi et al. | |
| 10,804,334 B2 | 10/2020 | Song et al. | |
| 2010/0219429 A1* | 9/2010 | Cok | H10K 59/877 257/89 |
| 2014/0312339 A1* | 10/2014 | Fujita | H10K 59/35 257/40 |
| 2019/0348470 A1* | 11/2019 | Song | H10K 59/8792 |
| 2020/0013766 A1* | 1/2020 | Kim | H01L 25/167 |
| 2020/0091464 A1 | 3/2020 | Park et al. | |

(Continued)

FOREIGN PATENT DOCUMENTS

| | | |
|---|---|---|
| KR | 10-1686713 | 12/2016 |
| KR | 10-2019-0130697 | 11/2019 |

(Continued)

*Primary Examiner* — Nduka E Ojeh
(74) *Attorney, Agent, or Firm* — CANTOR COLBURN LLP

(57) ABSTRACT

The according to an embodiment includes a substrate, a transistor disposed on the substrate, a light-emitting device electrically connected to the transistor, an encapsulation layer disposed on the light-emitting device, a partition wall disposed on the encapsulation layer and including an opening overlapping the light-emitting device, and a color converting layer, a low-refractive index layer, and a color filter sequentially stacked on each other in the opening.

19 Claims, 13 Drawing Sheets

(56) References Cited

U.S. PATENT DOCUMENTS

| | | | |
|---|---|---|---|
| 2020/0105838 A1* | 4/2020 | Kim | H10K 59/878 |
| 2020/0135811 A1* | 4/2020 | Jung | G02B 1/10 |
| 2020/0343310 A1 | 10/2020 | Bae et al. | |
| 2021/0134890 A1 | 5/2021 | Ichihashi et al. | |
| 2021/0305225 A1 | 9/2021 | Kim | |
| 2023/0327058 A1* | 10/2023 | Ohashi | H10K 59/879 |

FOREIGN PATENT DOCUMENTS

| | | |
|---|---|---|
| KR | 10-2020-0005692 | 1/2020 |
| KR | 1020200032294 A | 3/2020 |
| KR | 10-2020-0036234 | 4/2020 |
| KR | 10-2020-0124372 | 11/2020 |
| KR | 10-2177480 | 11/2020 |
| KR | 10-2021-0043064 | 4/2021 |

* cited by examiner

DISPLAY DEVICE HAVING COLOR FILTERS AND PARTITION AND METHOD FOR MANUFACTURING THE SAME

CROSS-REFERENCE TO RELATED APPLICATION(S)

This application claims priority to and benefits of Korean Patent Application No. 10-2021-0180602 under 35 U.S.C. 119, filed in the Korean Intellectual Property Office (KIPO) on Dec. 16, 2021, the entire contents of which are incorporated herein by reference.

BACKGROUND

1. Technical Field

The disclosure relates to a display device and a manufacturing method thereof.

2. Description of the Related Art

A display device is a device for displaying an image. Examples may include a liquid crystal display (LCD), an organic light emitting diode (OLED) display, and the like. A display device may be used in various electronic devices such as a mobile phone, a navigation device, a digital camera, an electronic book, a portable game machine, and various terminals.

An organic light emitting device may include two electrodes and an organic emission layer positioned between the two electrodes, and electrons injected from one electrode and holes injected from another electrode may be combined on the organic emission layer to generate excitons. In case that the excitons change to a ground state from an excited state, the excitons output energy and emit light.

Recently, display devices have been proposed that further include a color converting panel for the purpose of reducing optical loss and realizing a display device with high color reproducibility. The color converting panel may include semiconductor nanocrystals such as quantum dots, and may convert incident light into different colors. The color converting layer may further include scatterers.

The organic light emitting device may be formed by combining the display panel on which light-emitting devices may be formed and the color converting panel. As parts may be respectively formed on two substrates, and they may be bonded to each other to realize the display device, the display device may become thick, an optical loss may be generated, and a manufacturing cost may increase.

The above information disclosed in this Background section is only for enhancement of understanding of the background of the described technology, and therefore this section may contain information that does not form the prior art that is already known in this country to a person of ordinary skill in the art.

SUMMARY

The described technology has been made in an effort to provide a display device for reducing a thickness, an optical loss, and a manufacturing cost of a display device, and a manufacturing method thereof.

The described technology has been made in another effort to provide a display device for planarizing an upper side of a display device and preventing generation of diffused reflection on a surface, and a manufacturing method thereof.

An embodiment provides a display device that may include a substrate, a transistor disposed on the substrate, a light-emitting device electrically connected to the transistor, an encapsulation layer disposed on the light-emitting device, a partition wall disposed on the encapsulation layer and including an opening overlapping the light-emitting device, and a color converting layer, a low-refractive index layer, and a color filter sequentially stacked on each other in the opening.

The partition wall may include a first opening overlapping a light-emitting device of a first pixel, a second opening overlapping a light-emitting device of a second pixel, and a third opening overlapping a light-emitting device of a third pixel.

A first color converting layer, the low-refractive index layer, and a first color filter may be disposed in the first opening, a second color converting layer, the low-refractive index layer, and a second color filter may be disposed in the second opening, and a transmission layer, the low-refractive index layer, and a third color filter may be disposed in the third opening.

The low-refractive index layer may be disposed on the first color converting layer, the second color converting layer, and the transmission layer, and the low-refractive index layer may be disposed on a lateral side of the partition wall.

The low-refractive index layer may not be disposed on an upper side of the partition wall.

The first color filter, the second color filter, and the third color filter may not overlap each other.

The first color filter, the second color filter, and the third color filter may not be disposed on an upper side of the partition wall.

The display device may further include a first capping layer and a second capping layer that are disposed in the first opening, the second opening, and the third opening. The first capping layer may be disposed between the first color converting layer and the low-refractive index layer, between the second color converting layer and the low-refractive index layer, and between the transmission layer and the low-refractive index layer, and the second capping layer may be disposed between the low-refractive index layer and the first color filter, between the low-refractive index layer and the second color filter, and between the low-refractive index layer and the third color filter.

The first capping layer and the second capping layer may be disposed on an upper side of the partition wall.

The display device may further include an overcoat layer disposed on the first color filter, the second color filter, the third color filter, and the partition wall.

Another embodiment provides a method for manufacturing a display device. The method may include forming a transistor and a light-emitting device electrically connected to the transistor on a substrate, forming an encapsulation layer on the light-emitting device, forming a partition wall on the encapsulation layer, forming an opening overlapping the light-emitting device by patterning the partition wall, forming a color converting layer in the opening, forming a low-refractive index layer in the opening, and forming a color filter in the opening.

The forming of the color converting layer, the forming of the low-refractive index layer, and the forming of the color filter may be performed by using an inkjet printing process.

The patterning of the partition wall may include forming a first opening overlapping a light-emitting device of a first pixel, a second opening overlapping a light-emitting device of a second pixel, and a third opening overlapping a light-emitting device of a third pixel.

The forming of the color converting layer may include dropping different ink materials into the first opening, the second opening, and the third opening, forming a first color converting layer in the first opening, forming a second color converting layer in the second opening, and forming a transmission layer in the third opening.

The forming of the low-refractive index layer may include dropping a same ink material into the first opening, the second opening, and the third opening, and forming a low-refractive index layer on the first color converting layer, the second color converting layer, and the transmission layer.

The low-refractive index layer may be disposed on a lateral side of the partition wall, and the low-refractive index layer may not be disposed on an upper side of the partition wall.

The forming of the color filter may include dropping different ink materials in the first opening, the second opening, and the third opening, forming a first color filter in the first opening, forming a second color filter in the second opening, and forming a third color filter in the third opening. The first color filter, the second color filter, and the third color filter may be disposed on the low-refractive index layer.

The first color filter, the second color filter, and the third color filter may not overlap each other, and the first color filter, the second color filter, and the third color filter may not be disposed on an upper side of the partition wall.

The method may further include, before the forming of the low-refractive index layer, forming a first capping layer on the first color converting layer, the second color converting layer, and the transmission layer, and after the forming of the low-refractive index layer, forming a second capping layer on the low-refractive index layer.

The method may further include forming an overcoat layer on the first color filter, the second color filter, the third color filter, and the partition wall.

According to the embodiments, parts such as the light-emitting devices and the color converting layers may be formed on one substrate, thereby reducing the thickness of the display device, the optical loss, and the manufacturing cost.

Further, the upper side of the display device may be planarized, thereby preventing generation of the diffused reflection on the surface.

DETAILED DESCRIPTION OF THE EMBODIMENTS

Figure 1:
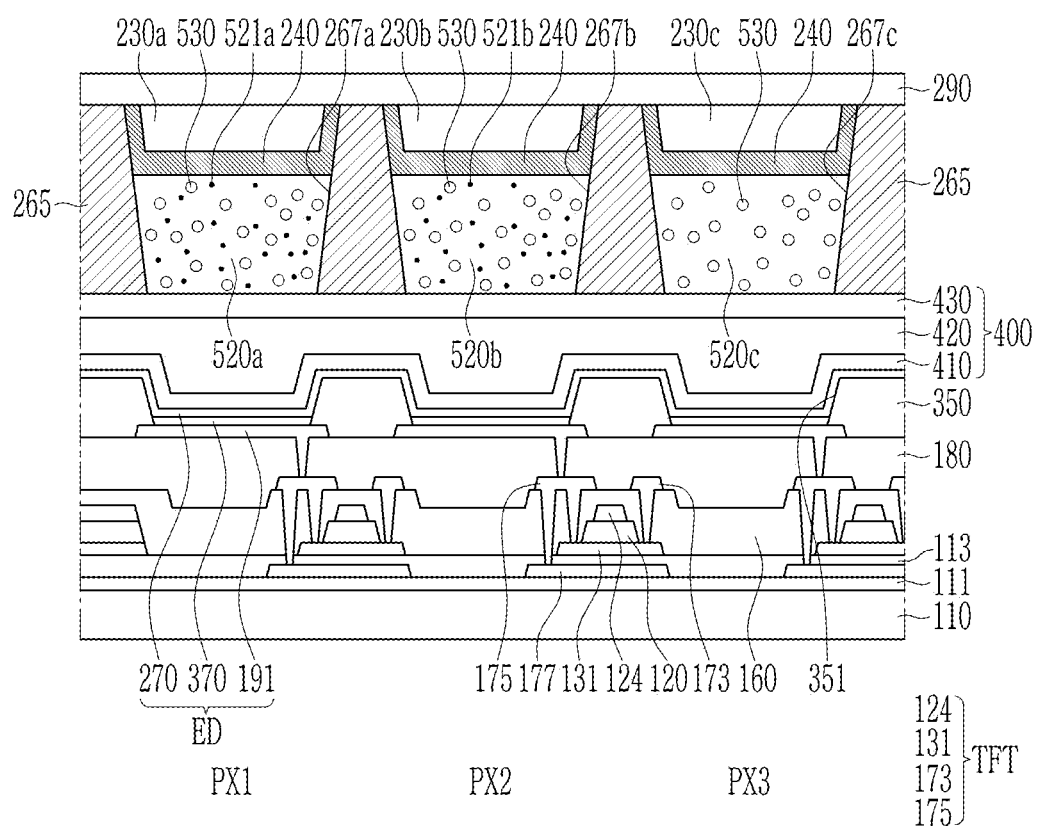
FIG. 1 schematically shows a cross-sectional view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Parts that may be less helpful to the description will be omitted to more clearly describe the disclosure, and the same elements will be designated by the same reference numerals throughout the specification.

The size and thickness of each configuration shown in the drawings may be arbitrarily shown for better understanding and ease of description, but the disclosure is not limited thereto.

It will be understood that when an element such as a layer, film, region, or substrate is referred to as being "on" another element, the element can be directly on the other element or intervening elements may also be present. In contrast, when an element is referred to as being "directly on" another element, there may be no intervening elements present. Terms such as "on", "above", "upper", "lower", "side", and the like, are spatially relative concepts, and are used only for ease of description. For example, the word "on" or "above" means positioned on or below the object portion, and does not necessarily mean positioned on the upper side of the object portion based on a gravitational direction.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless explicitly described to the contrary, terms such as "comprise", "has", "having", and "includes", and variations thereof, will be understood to imply the inclusion of stated elements but not the exclusion of any other elements.

The phrase "in a plan view" means viewing an object portion from a position, e.g., viewing from a top position. The phrase "in a cross-sectional view" means viewing a cross-section of which the object portion is cut from a position, e.g., viewing a vertically cut view from a side.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device according to an embodiment will now be described with reference to FIG. 1.

FIG. 1 schematically shows a cross-sectional view of a display device according to an embodiment.

As shown in FIG. 1, the display device according to an embodiment may include a substrate 110, a transistor TFT positioned (disposed) on the substrate 110, and a light-emitting device ED connected to the transistor TFT.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may be a rigid substrate or a flexible substrate that may be bent, folded, or rolled. The substrate 110 may be a single layer or a multilayer. The substrate 110 may be made by alternately stacking at least one base layer including sequentially stacked polymer resins and at least one organic layer.

A surface of the substrate 110 may be made flat. A buffer layer 111 may include an inorganic insulating material such as a silicon nitride (SiNx), a silicon oxide (SiOx), and/or a silicon oxynitride (SiOxNy), and/or an organic insulating material. The buffer layer 111 may have a single-layered or multi-layered structure of the material. A barrier layer (not shown) may be further positioned on the substrate 110. The barrier layer may be positioned between the substrate 110 and the buffer layer 111. The barrier layer may include an inorganic insulating material such as a silicon nitride (SiNx), a silicon oxide (SiOx), and/or a silicon oxynitride (SiOxNy). The barrier layer BA may have a single-layered or multi-layered structure of the material.

A light blocking layer 177 may be positioned on the buffer layer 111. The light blocking layer 177 may block light input to a semiconductor 131. The light blocking layer 177 may overlap the semiconductor 131, and may have a greater width than the semiconductor 131.

An insulating layer 113 may be positioned on the light blocking layer 177. The insulating layer 113 may include an inorganic insulating material such as a silicon nitride (SiNx), a silicon oxide (SiOx), and/or a silicon oxynitride (SiOxNy), and/or an organic insulating material. The insulating layer 113 may improve a characteristic of the semiconductor 131 by blocking an inflow of impurities to the semiconductor 131 from the substrate 110.

The semiconductor 131 may be positioned on the insulating layer 113. The semiconductor 131 may include at least one of amorphous silicon, polycrystalline silicon, and an oxide semiconductor. For example, the semiconductor 131 may include a low temperature polysilicon (LTPS) and/or an oxide semiconductor material including at least one of zinc (Zn), indium (In), gallium (Ga), tin (Sn), or a combination thereof. For example, the semiconductor 131 may include an indium-gallium-zinc oxide (IGZO). The semiconductor 131 may include a channel region, a source region, and a drain region distinguished by whether impurities may be doped. The source region and the drain region may have a conductive characteristic that corresponds to a conductor.

A gate insulating layer 120 may be positioned on the semiconductor 131. The gate insulating layer 120 may have a single-layered or multi-layered structure. The gate insulating layer 120 may include an inorganic insulating material such as a silicon nitride (SiNx), a silicon oxide (SiOx), and/or a silicon oxynitride (SiOxNy). The gate insulating layer 120 may cover at least part of the semiconductor 131. For example, the gate insulating layer 120 may overlap the channel region of the semiconductor 131. The gate insulating layer 120 may not overlap the source region and the drain region of the semiconductor 131. However, without being limited thereto, the gate insulating layer 120 may generally cover the semiconductor 131. The gate insulating layer 120 may be generally positioned on the substrate 110.

A gate electrode 124 may be positioned on the gate insulating layer 120. The gate electrode 124 may include a metal such as copper (Cu), molybdenum (Mo), aluminum (Al), silver (Ag), chromium (Cr), tantalum (Ta), or titanium (Ti), or a metal alloy thereof. The gate electrode 124 may be configured with a single layer or a multilayer. A region of the semiconductor 131 overlapping the gate electrode 124 in a plan view may be a channel region. In case that the gate electrode 124 is formed, a doping process or a plasma process may be performed. A portion of the semiconductor 131 covered by the gate electrode 124 may not be doped or plasma processed, and a portion of the semiconductor 131 not covered by the gate electrode 124 may be doped or plasma processed to thus have a same characteristic as the conductor. For example, the source region and the drain region of the semiconductor 131 may not overlap the gate electrode 124, and may be doped or plasma processed to have the same characteristic as the conductor.

A first interlayer insulating layer 160 may be positioned on the gate electrode 124. The first interlayer insulating layer 160 may be generally formed on the substrate 110. For example, the first interlayer insulating layer 160 may cover the gate insulating layer 120, the semiconductor 131, and the insulating layer 113. The first interlayer insulating layer 160 may have a single-layered or multi-layered structure. The first interlayer insulating layer 160 may include an inorganic insulating material and/or an organic insulating material.

A source electrode 173 and a drain electrode 175 may be positioned on the first interlayer insulating layer 160. The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and drain electrode 175 may be configured with a single layer or a multilayer. The source electrode 173 and the drain electrode 175 may be configured to be a triple layer including an upper layer, an intermediate layer, and a lower layer, and the upper layer and the lower layer may include titanium (Ti), and the intermediate layer may include aluminum (Al).

The first interlayer insulating layer 160 may include a source electrode 173 and an opening overlapping the source region of the semiconductor 131. The source electrode 173 may be connected to the source region of the semiconductor 131 through the opening formed in the first interlayer insulating layer 160. The first interlayer insulating layer 160 may include a drain electrode 175 and an opening overlapping the drain region of the semiconductor 131. The drain electrode 175 may be connected to the drain region of the semiconductor 131 through the opening formed in the first interlayer insulating layer 160. The first interlayer insulating layer 160 may further include an opening overlapping the drain electrode 175 and the light blocking layer 177. The opening may be made in the insulating layer 113. The drain electrode 175 may be connected to the light blocking layer 177 through the opening made in the first interlayer insulating layer 160 and the insulating layer 113.

The above-noted semiconductor 131, the gate electrode 124, the source electrode 173, and the drain electrode 175 may configure one transistor TFT. Depending on embodiments, the transistor TFT may include the source region and the drain region of the semiconductor 131 instead of the source electrode 173 and the drain electrode 175.

The display device according to an embodiment may include a first pixel PX1, a second pixel PX2, and a third pixel PX3. One first pixel PX1, one second pixel PX2, and one third pixel PX3 are shown, and without being limited thereto, the display device according to an embodiment may include multiple first pixels PX1, multiple second pixels PX2, and multiple third pixels PX3. The first pixels PX1, the second pixels PX2, and the third pixels PX3 may be disposed in various ways. One transistor TFT is shown to be disposed on the first pixel PX1, the second pixel PX2, and the third pixel PX3, and without being limited thereto, multiple transistors TFT may be positioned on the respective first pixels PX1, the second pixels PX2, and the third pixels PX3. For example, a switching transistor and a driving transistor may be positioned on the respective first pixels PX1, the second pixels PX2, and the third pixels PX3. Although not shown, at least one capacitor may be positioned on the respective first pixels PX1, the second pixels PX2, and the third pixels PX3.

A second interlayer insulating layer 180 may be positioned on the source electrode 173 and the drain electrode 175. The second interlayer insulating layer 180 may cover the source electrode 173, the drain electrode 175, and the first interlayer insulating layer 160. The second interlayer insulating layer 180 may planarize the surface of the substrate 110 on which transistors TFT may be installed, may be an organic insulator, and may include at least one material of a polyimide, a polyamide, an acryl resin, benzocyclobutene, and a phenol resin.

A pixel electrode 191 may be positioned on the second interlayer insulating layer 180. The pixel electrode 191 may also be referred to as an anode, and may be a single layer including a transparent conductive oxide film or a metal material, or a multilayer including the same. The transparent conductive oxide film may include an indium tin oxide (ITO), a poly-ITO, an indium zinc oxide (IZO), an indium gallium zinc oxide (IGZO), and/or an indium tin zinc oxide (ITZO). The metal material may include silver (Ag), molybdenum (Mo), copper (Cu), gold (Au), and/or aluminum (Al).

The second interlayer insulating layer 180 may include an opening overlapping the pixel electrode 191 and the drain electrode 175. The pixel electrode 191 may be connected to the drain electrode 175 through the opening of the second interlayer insulating layer 180. Accordingly, the pixel electrode 191 may receive an output current to be transmitted to the emission layer 370 from the drain electrode 175.

A bank layer 350 may be positioned on the pixel electrode 191 and the second interlayer insulating layer 180. The bank layer 350 may also be referred to as a pixel defining layer (PDL), and includes a pixel opening 351 overlapping at least part of the pixel electrode 191. The pixel opening 351 may overlap a center portion of the pixel electrode 191, and may not overlap an edge of the pixel electrode 191. Therefore, the pixel opening 351 may be smaller than the pixel electrode 191. The bank layer 350 may partition a formation position of the emission layer 370 so that the emission layer 370 may be positioned on a portion in which an upper side of the pixel electrode 191 may be exposed. The bank layer 350 may be an organic insulator including at least one material of a polyimide, a polyamide, an acryl resin, benzocyclobutene, and a phenol resin. Depending on embodiments, the bank layer 350 may be formed with a black pixel defining layer (BPDL) including a black color pigment.

The bank layer 350 may be positioned on a boundary between the first pixel PX1 and the second pixel PX2, between the second pixel PX2 and the third pixel PX3, and between the third pixel PX3 and the first pixel PX1. For example, the bank layer 350 may be positioned on the boundary among pixels.

Multiple pixel openings 351 may respectively have a similar shape to the pixel electrode 191 in a plan view. For example, the pixel opening 351 and the pixel electrode 191 may substantially have polygonal shapes in a plan view. Corners of the pixel opening 351 and the pixel electrode 191 may be chamfered. The shapes of the pixel opening 351 and the pixel electrode 191 are not limited thereto, and may be modifiable in many ways.

In this instance, multiple pixel electrodes 191 corresponding to the respective first pixel PX1, the second pixel PX2, and the third pixel PX3 may have different sizes in a plan view. In a like manner, multiple pixel openings 351 corresponding to the respective first pixel PX1, the second pixel PX2, and the third pixel PX3 may have different sizes in a plan view. For example, the pixel opening 351 and the pixel electrode 191 corresponding to the first pixel PX1 may have greater sizes than the pixel opening 351 and the pixel electrode 191 corresponding to the second pixel PX2 in a plan view. The pixel opening 351 and the pixel electrode 191 corresponding to the first pixel PX1 may have smaller or similar sizes than/to the pixel opening 351 and the pixel electrode 191 corresponding to the third pixel PX3 in a plan view. However, without being limited thereto, the respective pixel opening 351 and the pixel electrode 191 may be set to have various sizes.

An emission layer 370 may be positioned in the pixel opening 351 partitioned by the bank layer 350. However, without being limited thereto, the emission layer 370 may be positioned on the bank layer 350 as well as in the pixel opening 351. For example, the emission layer 370 may be generally formed on the substrate 110. The emission layer 370 may be formed by performing a deposition process by using an open mask of which a portion corresponding to the display area may be opened. The emission layer 370 may include a low molecular or polymer organic material. The emission layer 370 is shown to be a single layer, and in actuality, auxiliary layers such as an electron injecting layer, an electron transport layer, a hole transport layer, and a hole injecting layer may be included above/below the emission layer 370. The hole injecting layer and the hole transport layer may be positioned on a lower portion of the emission layer 370, and the electron transport layer and the electron injecting layer may be positioned on an upper portion of the emission layer 370. Another emission layer may be further positioned on the emission layer 370. For example, at least two emission layers 370 may be stacked on each other.

Although not shown, a spacer may be further positioned on the bank layer 350. The spacer may include a same material as the bank layer 350. However, without being limited thereto, the spacer may be made of a material that may be different from that of the bank layer 350. The spacer may be an organic insulator including at least one material of a polyimide, a polyamide, an acryl resin, benzocyclobutene, and a phenol resin.

The common electrode 270 may be positioned on the bank layer 350 and the emission layer 370. The common electrodes 270 of the respective pixels PX1, PX2, and PX3 may be connected to each other. The common electrodes 270 may be formed to be generally connected to each other on the substrate 110. The common electrodes 270 may also be referred to as a cathode, and may be made of a transparent conductive layer including an indium tin oxide (ITO), an indium zinc oxide (IZO), an indium gallium zinc oxide (IGZO), and/or an indium tin zinc oxide (ITZO). The common electrodes 270 may be made of a metal material such as silver (Ag), magnesium (Mg), or a mixture thereof. Thicknesses of the common electrodes 270 may be adjusted to be formed as a transparent conductive layer. The common electrodes 270 may have a semi-transparent characteristic, and may configure a microcavity with the pixel electrode 191.

The pixel electrode 191, the emission layer 370, and the common electrode 270 may configure a light-emitting device ED. On the first pixel PX1, the second pixel PX2, and the third pixel PX3, portions overlapping the pixel electrode 191, the emission layer 370, and the common electrode 270 may become light emitting regions of the respective light-emitting devices ED.

An encapsulation layer 400 may be positioned on the common electrode 270. The encapsulation layer 400 may include at least one inorganic film and/or at least one organic film. In an embodiment, the encapsulation layer 400 may include a first inorganic encapsulation layer 410, an organic encapsulation layer 420, and a second inorganic encapsulation layer 430. However, the number of inorganic films and organic films configuring the encapsulation layer 400 may be modifiable in many ways. The display device according to an embodiment may include a display area for displaying a screen and a peripheral area for surrounding the display area. The first inorganic encapsulation layer 410, the organic encapsulation layer 420, and the second inorganic encapsulation layer 430 may be positioned in part of the display area and the peripheral area. Depending on embodiments, the organic encapsulation layer 420 may be formed around the display area, and the first inorganic encapsulation layer 410 and the second inorganic encapsulation layer 430 may be formed up to the peripheral area. The encapsulation layer 400 may protect the light-emitting device (ED) from moisture or oxygen that may be input from the outside, and end portions of the first inorganic encapsulation layer 410 and the second inorganic encapsulation layer 430 may be formed to directly contact each other.

A partition wall 265 may be positioned on the encapsulation layer 400. The partition wall 265 may overlap the bank layer 350. The partition wall 265 may be positioned on the boundary among the respective pixels PX1, PX2, and PX3. The partition wall 265 may be made of a photosensitive resin. The partition wall 265 may include a colored pigment such as a black pigment or a blue pigment. A thickness of the partition wall 265 may be equal to or greater than about 10 µm and equal to or less than about 20 µm. A width of the partition wall 265 may be gradually reduced going away from the encapsulation layer 400. The width of the partition wall 265 may be gradually reduced going away from the substrate 110. However, without being limited thereto, the width of the partition wall 265 may be constant. In yet another embodiment, the width of the partition wall 265 may be gradually increased going away from the substrate 110.

The partition wall 265 may include openings 267a, 267b, and 267c. The openings 267a, 267b, and 267c may include a first opening 267a, a second opening 267b, and a third opening 267c. The first opening 267a may overlap the light emitting region of the light-emitting device ED of the first pixel PX1, the second opening 267b may overlap the light emitting region of the light-emitting device ED of the second pixel PX2, and the third opening 267c may overlap the light emitting region of the light-emitting device ED of the third pixel PX3. The openings 267a, 267b, and 267c of the partition wall 265 may overlap the pixel opening 351 of the bank layer 350. The first opening 267a, the second opening 267b, and the third opening 267c may be separated from each other by the partition wall 265. For example, the first opening 267a, the second opening 267b, and the third opening 267c may be surrounded by the partition wall 265.

A first color converting layer 520a may be positioned in the first opening 267a, a second color converting layer 520b may be positioned in the second opening 267b, and a transmission layer 520c may be positioned in the third opening 267c.

The first color converting layer 520a may convert light input from the light-emitting device ED of the first pixel PX1 into light with a first wavelength. Light with a first wavelength may be red light with a maximum light-emitting peak wavelength of about 600 nm to about 650 nm, for example, about 620 nm to about 650 nm. The first color converting layer 520a may include first quantum dots 521a and scatterers 530.

The second color converting layer 520b may convert light input from the light-emitting device ED of the second pixel PX2 into light with a second wavelength. Light with a second wavelength may be green light with the maximum light-emitting peak wavelength of about 500 nm to about 550 nm, for example, about 510 nm to about 550 nm. The second color converting layer 520b may include second quantum dots 521b and scatterers 530.

The transmission layer 520c may transmit light input from the light-emitting device ED of the third pixel PX3. The light having been transmitted through the transmission layer 520c may be light with a third wavelength. Light with a third wavelength may be blue light with the maximum light-emitting peak wavelength of about 380 nm to about 480 nm, for example, equal to or greater than about 420 nm, equal to or greater than about 430 nm, equal to or greater than about 440 nm, or equal to or greater than about 445 nm and equal to or less than about 470 nm, equal to or less than about 460 nm, or equal to or less than about 455 nm. The transmission layer 520c may include scatterers 530.

The scatterers 530 may increase light efficiency by scattering the light input to the first color converting layer 520a, the second color converting layer 520b, and the transmission layer 520c.

The first quantum dot 521a and the second quantum dot 521b (also referred to as semiconductor nanocrystals) may independently include a group II-VI compound, a group III-V compound, a group IV-VI compound, a group IV element or compound, a group I-III-VI compound, a group II-III-VI compound, a group I-II-IV-VI compound, or a combination thereof. The quantum dots may not include cadmium.

The group II-VI compound may be selected from a binary element compound selected from among CdSe, CdTe, ZnS, ZnSe, ZnTe, ZnO, HgS, HgSe, HgTe, MgSe, MgS, or a combination thereof; a ternary element compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound selected from among HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The group II-VI compound may further include a group III metal.

The group III-V compound may be selected from a binary element compound selected from among GaN, GaI, GaAs, GaSb, AlN, AlP, AlAs, AlSb, InN, InP, InAs, InSb, or a combination thereof; a ternary element compound selected from among GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound selected from among GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The group III-V compound may further include a group II metal (e.g., InZnP).

The group IV-VI compound may be selected from a binary element compound selected from among SnS, SnSe, SnTe, PbS, PbSe, PbTe, or a combination thereof; a ternary element compound selected from among SnSeS, SnSeTe, SnSTe, PbSeS, PbSeTe, PbSTe, SnPbS, SnPbSe, SnPbTe, or a combination thereof; and a quaternary element compound selected from among SnPbSSe, SnPbSeTe, SnPbSTe, or a combination thereof.

The group IV element or compound may be selected from a singular element material selected from among Si, Ge, or a combination thereof; and a binary element compound selected from among SiC, SiGe, or a combination thereof, and is not limited thereto.

Examples of the group I-III-VI compound include CuInSe$_2$, CuInS$_2$, CuInGaSe, and CuInGaS, but are not limited thereto Examples of the group I-II-IV-VI compound include CuZnSnSe and CuZnSnS, but are not limited thereto. The group IV element or compound may be a single element selected from among Si, Ge, or a combination thereof, or a binary compound selected from among SiC, SiGe, or a combination thereof.

The group II-III-VI compound may be selected from among ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MAlS, MgInS, MgGaSe, MgAlSe, MgInSe, and a combination thereof, but are not limited thereto.

The group I-II-IV-VI compound may be selected from among CuZnSnSe and CuZnSnS, but are not limited thereto.

In an embodiment, the quantum dots may not include cadmium. The quantum dots may include semiconductor nanocrystals based on the group III-V compound including indium and phosphorus. The group III-V compound may further include zinc. The quantum dots may include a semiconductor nanocrystal based on the group II-VI compound including a chalcogen (e.g., sulfur, selenium, tellurium, or a combination thereof) and zinc.

Regarding the quantum dot, the above-described binary compound, the tertiary compound, and/or the quaternary compound may exist in the particles with uniform concentration, or may exist in the same particles with a concentration distribution partially divided into some states. Further, the color conversion media layer may have a core/shell structure where one quantum dot surrounds another quantum dot. An interface between the core and the shell may have a concentration gradient such that a concentration of an element existing in the shell may be gradually reduced nearing the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multilayer. An interface between the core and the shell may have a concentration gradient such that a concentration of an element existing in the shell may be gradually reduced nearing the center thereof. Examples of the shell of the quantum dot include a metallic or non-metallic oxide, a semiconductor compound, or a combination thereof.

For example, the metallic or non-metallic oxide may include binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or tertiary compounds such as $MgAl_2O_4$, $CoFe_2O_4$, $NiFe_2O_4$, and/or $CoMn_2O_4$, but the disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb, and the disclosure is not limited thereto.

An interface between the core and the shell may have a concentration gradient such that a concentration of an element existing in the shell may be gradually reduced nearing the center thereof. The semiconductor nanocrystal may have a structure including a semiconductor nanocrystal core and a multi-layered shell surrounding the semiconductor nanocrystal core. In an embodiment, the multi-layered shell may have two or more layers, for example, two, three, four, five, or more layers. The two adjacent layers of the shell may have a single composition or different compositions. In the multi-layered shell, each layer may have a composition that varies along the radius.

The quantum dots may have a full width at half maximum (FWHM) of a light-emitting wavelength spectrum that may be less than about 45 nm, less than about 40 nm, or less than about 30 nm, and color purity or color reproducibility may be improved within this range. Further, light emitted through the quantum dot may be output in all directions, thereby improving a light viewing angle.

Regarding the quantum dots, a shell material and a core material may have different energy bandgaps. For example, the energy bandgap of the shell material may be greater than that of the core material. In another embodiment, the energy bandgap of the shell material may be less than that of the core material. The quantum dots may have a multi-layered shell. Regarding the multi-layered shell, the energy bandgap of an outer layer may be greater than the energy bandgap of an inner layer (i.e., a layer that may be near the core).

Regarding the multi-layered shell, the energy bandgap of the outer layer may be less than the energy bandgap of the inner layer.

The quantum dots may adjust the absorption/emission wavelength by adjusting the composition and the size thereof. The maximum light-emitting peak wavelength of the quantum dots may have a wavelength range from ultraviolet to infrared or higher.

The quantum dots may include an organic ligand (e.g., having a hydrophobic residue and/or a hydrophilic residue). The organic ligand residue may be combined to the surface of the quantum dot. The organic ligand may include $RCOOH$, $RNH_2$, $R_2NH$, $R_3N$, $RSH$, $R_3PO$, $R_3P$, $ROH$, $RCOOR$, $RPO\,(OH)_2$, $RHPOOH$, $R_2POOH$, or a combination thereof, and here, R may independently be a C3 to C40 substituted or unsubstituted aliphatic hydrocarbon group such as a C3 to C40 (e.g., C5 to C24) substituted or unsubstituted alkyl group, or a substituted or unsubstituted alkenyl group, a C6 to C40 (e.g., C6 to C20) substituted or unsubstituted aromatic hydrocarbon group such as a C6 to C40 substituted or unsubstituted aryl group, or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, and/or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, and/or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, and/or benzoic acid; phosphine compounds such as methyl phosphine, ethyl phosphine, propyl phosphine, butyl phosphine, pentyl phosphine, octyl phosphine, dioctyl phosphine, tributyl phosphine, and/or trioctyl phosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, and/or trioctyl phosphine oxide; diphenyl phosphine, or a triphenyl phosphine compound or oxide compounds thereof; C5 to C20 alkyl phosphinic acids such as hexyl phosphinic acid, octyl phosphinic acid, dodecane phosphinic acid, tetradecane phosphinic acid, hexadecane phosphinic acid, and/or octadecane phosphinic acid; and C5 to C20 alkyl phosphonic acids. The quantum dot may include the organic ligand alone or as a mixture of at least one kind. The hydrophobic organic ligand may not include a photopolymerizable residue (e.g., acrylate or methacrylate).

A low-refractive index layer 240 may be positioned on the first color converting layer 520a, the second color converting layer 520b, and the transmission layer 520c. The low-refractive index layer 240 may be positioned in the first opening 267a, the second opening 267b, and the third opening 267c. The low-refractive index layer 240 may be positioned on the first color converting layer 520a in the first opening 267a, and may cover a lateral side of the partition wall 265. The low-refractive index layer 240 may be positioned on the second color converting layer 520b in the second opening 267b, and may cover the lateral side of the partition wall 265. The low-refractive index layer 240 may be positioned on the transmission layer 520c in the third opening 267c, and may cover the lateral side of the partition wall 265. The low-refractive index layer 240 may include an organic material or an inorganic material with a low refractive index. For example, the refractive index of the low-refractive index layer 240 may be equal to or greater than about 1.1 and equal to or less than about 1.3.

A first color filter 230a, a second color filter 230b, and a third color filter 230c may be positioned on the low-refractive index layer 240. The first color filter 230a may be positioned in the first opening 267a, the second color filter 230b may be positioned in the second opening 267b, and the third color filter 230c may be positioned in the third opening 267c.

The first color filter 230a may transmit light with a first wavelength and may absorb light with other wavelengths so the first color filter 230a may increase purity of light with a first wavelength discharged to an outside of the display device. The first color filter 230a may be surrounded by the low-refractive index layer 240 in the first opening 267a. A bottom surface and a lateral side of the first color filter 230a may contact the low-refractive index layer 240. The first color filter 230a may not contact the partition wall 265. The first color filter 230a may overlap the first color converting layer 520a. The low-refractive index layer 240 may be positioned between the first color filter 230a and the first color converting layer 520a.

The second color filter 230b may transmit light with a second wavelength and may absorb light with other wavelengths so the second color filter 230b may increase purity of light with a second wavelength discharged to the outside of the display device. The second color filter 230b may be surrounded by the low-refractive index layer 240 in the second opening 267b. A bottom surface and a lateral side of the second color filter 230b may contact the low-refractive index layer 240. The second color filter 230b may not contact the partition wall 265. The second color filter 230b may overlap the second color converting layer 520b. The low-refractive index layer 240 may be positioned between the second color filter 230b and the second color converting layer 520b.

The third color filter 230c may transmit light with a third wavelength and may absorb light with other wavelengths so the third color filter 230c may increase purity of light with a third wavelength discharged to the outside of the display device. The third color filter 230c may be surrounded by the low-refractive index layer 240 in the third opening 267c. A bottom surface and a lateral side of the third color filter 230c may contact the low-refractive index layer 240. The third color filter 230c may not contact the partition wall 265. The third color filter 230c may overlap the transmission layer 520c. The low-refractive index layer 240 may be positioned between the third color filter 230c and the transmission layer 520c.

The first color filter 230a, the second color filter 230b, and the third color filter 230c have been described to not contact the partition wall 265, but are not limited thereto. Depending on cases, at least some of the first color filter 230a, the second color filter 230b, and the third color filter 230c may contact the partition wall 265.

A thickness of the partition wall 265 may correspond to thicknesses of the first color converting layer 520a, the low-refractive index layer 240, and the first color filter 230a. For example, the thickness of the partition wall 265 may be equal to or greater than a sum of the thicknesses of the first color converting layer 520a, the low-refractive index layer 240, and the first color filter 230a. The thickness of the partition wall 265 may correspond to the thicknesses of the second color converting layer 520b, the low-refractive index layer 240, and the second color filter 230b. For example, the thickness of the partition wall 265 may be equal to or greater than a sum of the thicknesses of the second color converting layer 520b, the low-refractive index layer 240, and the second color filter 230b. The thickness of the partition wall 265 may correspond to the thicknesses of the transmission layer 520c, the low-refractive index layer 240, and the third color filter 230c. For example, the thickness of the partition wall 265 may be equal to or greater than a sum of the thicknesses of the transmission layer 520c, the low-refractive index layer 240, and the third color filter 230c thickness.

An overcoat layer 290 may be positioned on the first color filter 230a, the second color filter 230b, the third color filter 230c, and the partition wall 265. The overcoat layer 290 may include an inorganic insulating material such as a silicon nitride (SiNx), a silicon oxide (SiOx), and/or a silicon oxynitride (SiOxNy), and/or an organic insulating material. The overcoat layer 290 may have a single-layered or multi-layered structure of the material. The overcoat layer 290 may planarize upper sides of the first color filter 230a, the second color filter 230b, the third color filter 230c, and the partition wall 265.

Regarding the display device according to an embodiment, a transistor TFT, a light-emitting device ED, color converting layers 520a and 520b, a transmission layer 520c, and color filters 230a, 230b, and 230c may be formed on one substrate 110. The display device according to an embodiment may not be made by forming the color converting layers 520a and 520b, the transmission layer 520c, and the color filters 230a, 230b, and 230c on an additional substrate and bonding the same by use of a filling layer. Therefore, another filling layer may not be positioned between the encapsulation layer 400 and the color converting layer. No additional substrate may be positioned on the color filters 230a, 230b, and 230c. As no additional substrate for forming the color converting layers 520a and 520b may be used as described above, the entire thickness of the display device may be reduced. Light loss may be reduced by reducing the distance between the light-emitting device ED and the color converting layers 520a and 520b, and the distance between the light-emitting device ED and the transmission layer 520c. The process for manufacturing a display device may also be simplified, and the manufacturing cost may be reduced.

The color filters 230a, 230b, and 230c may be formed in the openings 267a, 267b, and 267c of the partition wall 265, so the color filters 230a, 230b, and 230c may not overlap each other on the boundary among the respective pixels PX1, PX2, and PX3. Therefore, upper sides of the color filters 230a, 230b, and 230c may be flat. The upper sides of the color filters 230a, 230b, and 230c and the upper side of the partition wall 265 may be flat. Hence, the upper side of the overcoat layer 290 may be flat, and generation of a diffused reflection on the surface of the display device may be prevented.

The low-refractive index layer 240 may cover the lateral side of the partition wall 265 in the openings 267a, 267b, and 267c, so light inputted to the lateral side of the partition wall 265 may be totally reflected and may be discharged to the front. Therefore, efficiency of emitting light to the front of the display device may be increased.

A method for manufacturing a display device according to an embodiment will now be described with reference to FIG. 2 to FIG. 11 together with FIG. 1.

Figure 6:
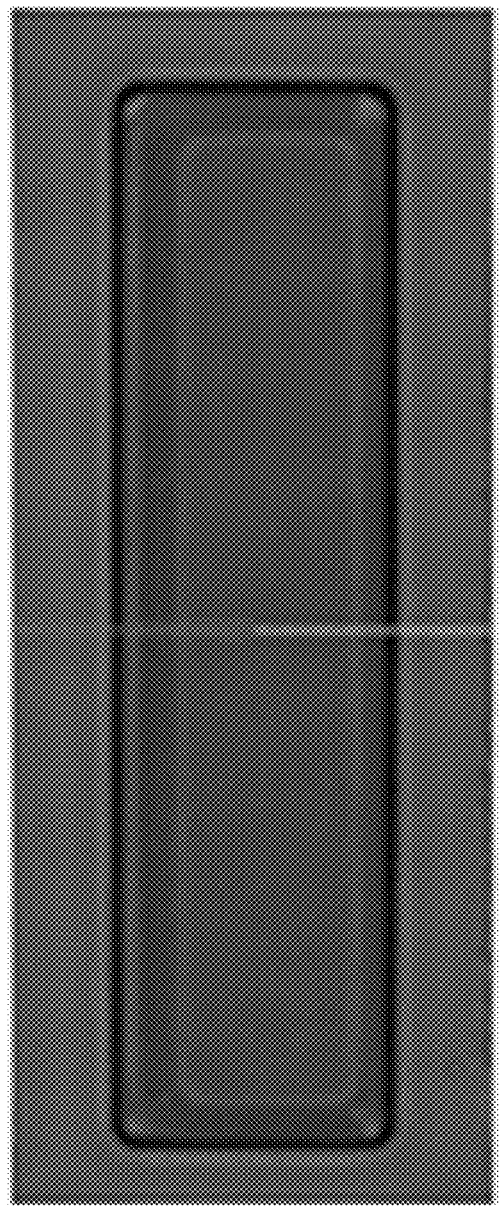
FIG. 6 and FIG. 8 schematically show a flat surface of a layer in a process for manufacturing a display device according to an embodiment.
Figure 7:
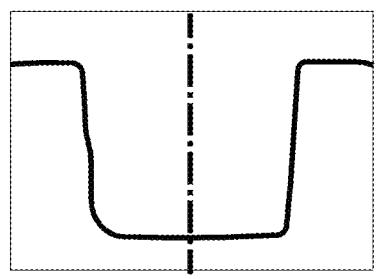
FIG. 7 and FIG. 9 schematically show cross-sectional views of a layer in a process for manufacturing a display device according to an embodiment.
Figure 8:
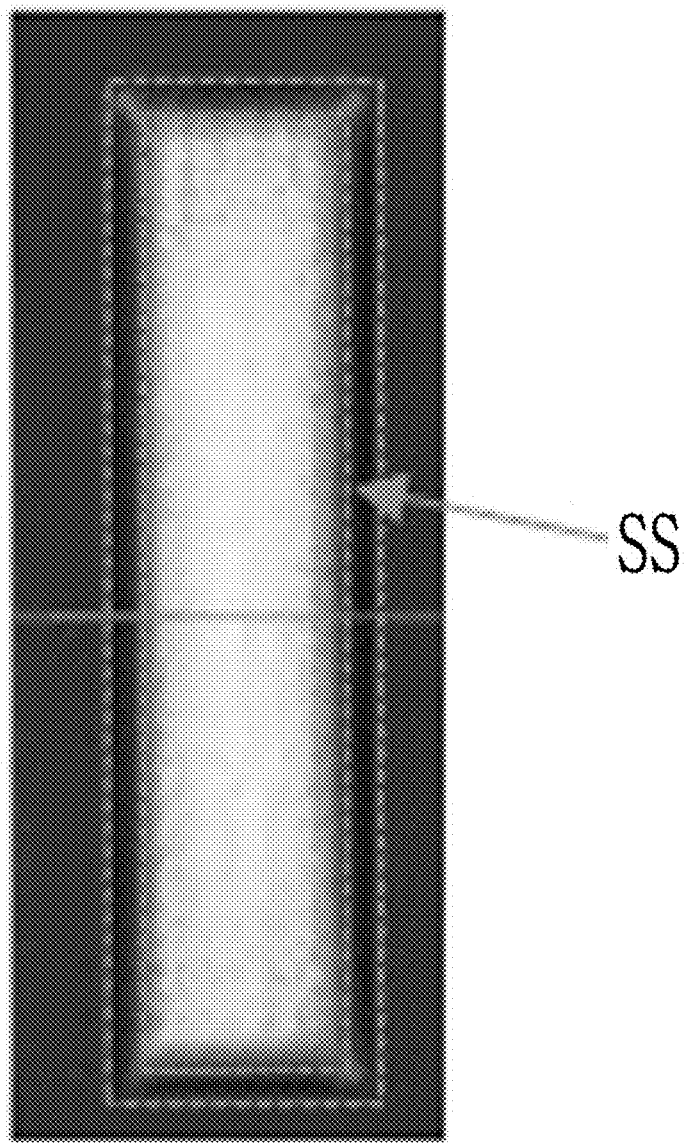
Figure 9:
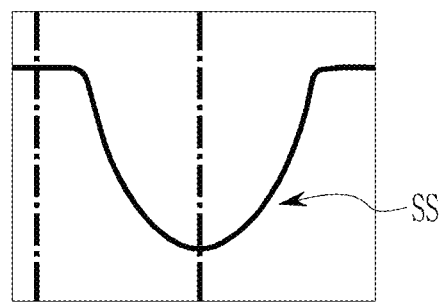

FIG. 2 to FIG. 5, FIG. 10, and FIG. 11 schematically show cross-sectional views in order of a process for manufacturing a display device according to an embodiment. FIG. 6 and FIG. 8 schematically show a flat surface of a layer in a process for manufacturing a display device according to an embodiment, and FIG. 7 and FIG. 9 schematically show cross-sectional views of a layer in a process for manufacturing a display device according to an embodiment.

Figure 2:
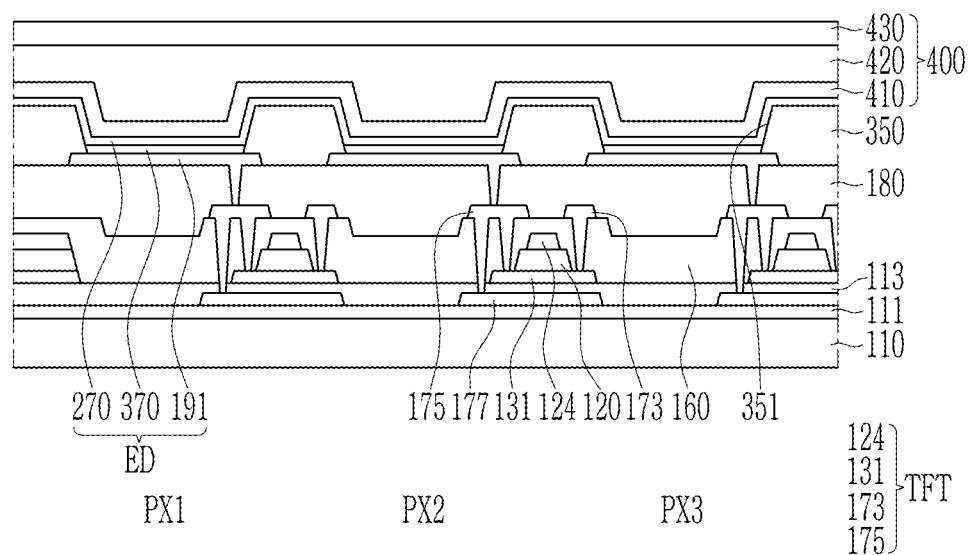
FIG. 2 to FIG. 5, FIG. 10, and FIG. 11 schematically show cross-sectional views in order of a process for manufacturing a display device according to an embodiment.

As shown in FIG. 2, a transistor TFT may be formed on the substrate 110, and a light-emitting device ED connected to the transistor TFT may be formed.

A conductive material such as a metal material may be deposited on the substrate 110, and a photo and etching process may be performed to thus form a light blocking layer 177, a gate electrode 124, a source electrode 173, a drain electrode 175, a pixel electrode 191, and a common electrode 270. The semiconductor 131 may be formed by forming a semiconductor material layer and performing a photo and etching process. A buffer layer 111, an insulating layer 113, a gate insulating layer 120, a first interlayer insulating layer 160, and a second interlayer insulating layer 180 may be formed by using the inorganic insulating material or the organic insulating material. An emission layer 370 may be formed by using a light emitting material.

An encapsulation layer 400 may be generally formed on the substrate 110 in case that the common electrode 270 is formed. The first inorganic encapsulation layer 410, the organic encapsulation layer 420, and the second inorganic encapsulation layer 430 may be sequentially formed.

Figure 3:
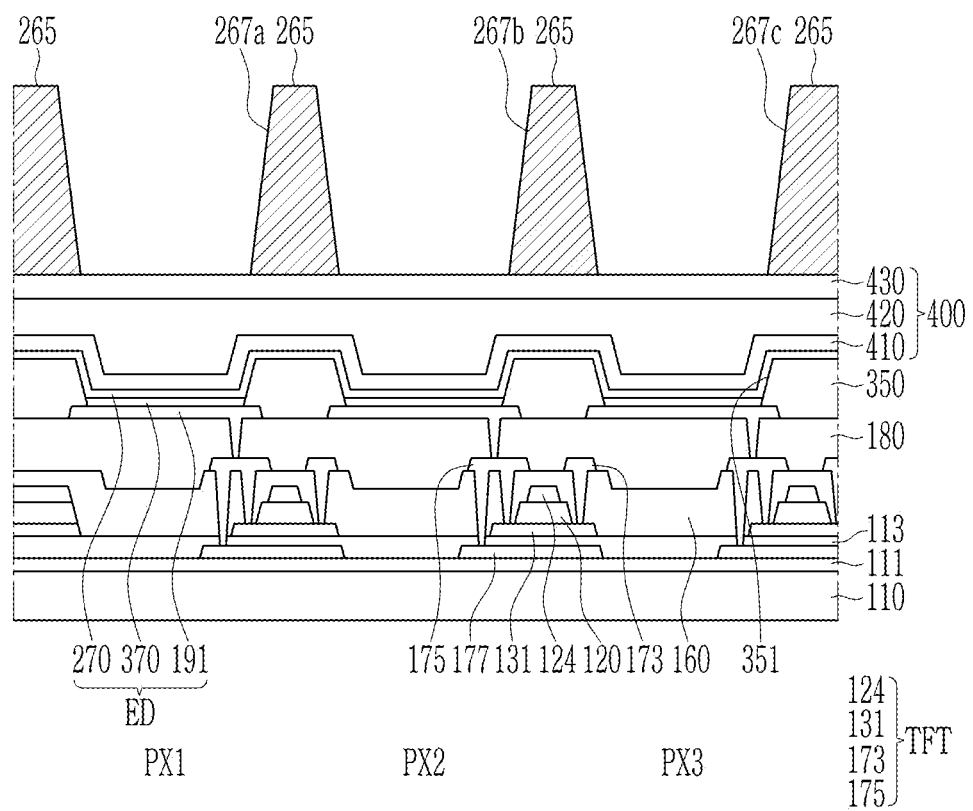

As shown in FIG. 3, a partition wall 265 may be formed on the encapsulation layer 400 by using a photosensitive resin including a colored pigment such as a black pigment or a blue pigment. The partition wall 265 may generally be formed on the encapsulation layer 400 and may be patterned to form openings 267a, 267b, and 267c, and a curing process may be performed. The first opening 267a overlapping the light-emitting device ED of the first pixel PX1, the second opening 267b overlapping the light-emitting device ED of the second pixel PX2, and the third opening 267c overlapping the light-emitting device ED of the third pixel PX3 may be formed. The first opening 267a may overlap the pixel opening 351 of the first pixel PX1, the second opening 267b may overlap the pixel opening 351 of the second pixel PX2, and the third opening 267c may overlap the pixel opening 351 of the third pixel PX3.

The lateral side of the partition wall 265 may have a tapered shape. For example, the lateral side of the partition wall 265 may have an inclined angle with respect to the upper side of the encapsulation layer 400. The width of the partition wall 265 may be gradually reduced going away from the encapsulation layer 400. The widths of the openings 267a, 267b, and 267c may be gradually increased going away from the encapsulation layer 400.

Figure 4:
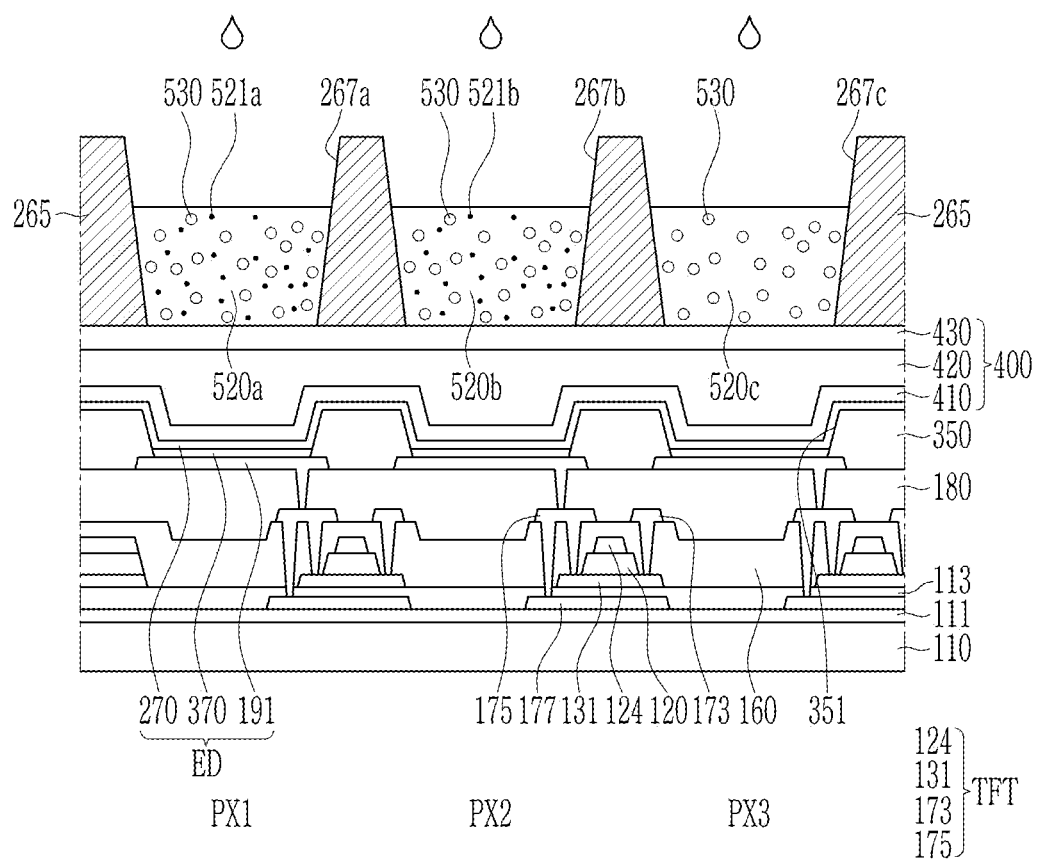

As shown in FIG. 4, by performing an inkjet printing process, the first color converting layer 520a may be formed in the first opening 267a, the second color converting layer 520b may be formed in the second opening 267b, and the transmission layer 520c may be formed in the third opening 267c.

Different ink materials may be dropped into the first opening 267a, the second opening 267b, and the third opening 267c. The inkjet printing process may be performed by using an inkjet printing device including nozzles, and the ink materials may be dropped in the openings 267a, 267b, and 267c while moving the nozzles. Depending on cases, there may be errors in the positions of the nozzles, and the ink materials may be dropped to the outside of the openings 267a, 267b, and 267c. The ink may be dropped on the upper side of the partition wall 265. The upper side of the partition wall 265 may be repellent so as to have a hydrophobic property. Therefore, the ink material dropped on the upper side of the partition wall 265 may move into the openings 267a, 267b, and 267c.

The first color converting layer 520a may include first quantum dots 521a and scatterers 530. The second color converting layer 520b may include second quantum dots 521b and scatterers 530. The transmission layer 520c may include scatterers 530.

Figure 5:
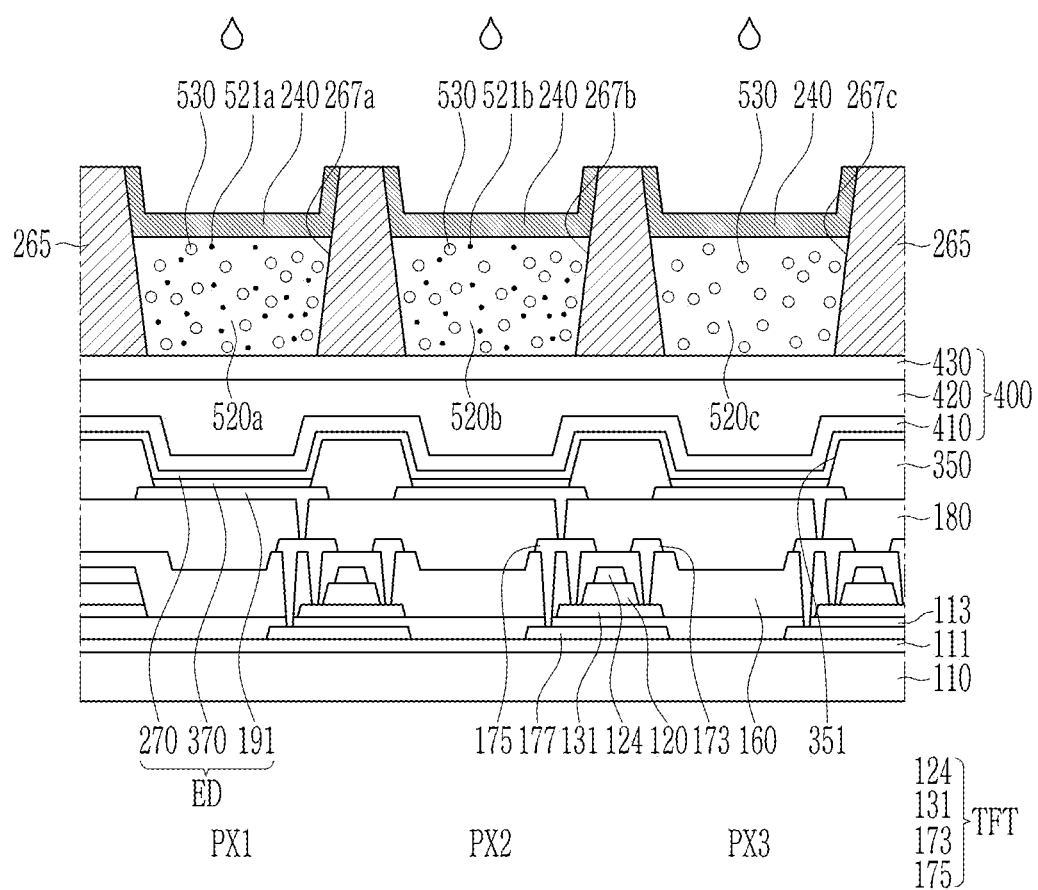

As shown in FIG. 5, the low-refractive index layer 240 may be formed in the first opening 267a, the second opening 267b, and the third opening 267c by performing the inkjet printing process. The low-refractive index layer 240 may be made by using a material with a low refractive index. The low-refractive index layer 240 may include an organic material and/or an organic material with the low refractive index of equal to or greater than about 1.1 and equal to or less than about 1.3.

The same ink material may be dropped in the first opening 267a, the second opening 267b, and the third opening 267c. The inkjet printing process may be performed by using the inkjet printing device including nozzles, and the ink material may be dropped in the openings 267a, 267b, and 267c while moving the nozzles. In the first opening 267a, the low-refractive index layer 240 may be positioned on the first color converting layer 520a, and may cover the lateral side of the partition wall 265. In the second opening 267b, the low-refractive index layer 240 may be positioned on the second color converting layer 520b and may cover the lateral side of the partition wall 265. In the third opening 267c, the low-refractive index layer 240 may be positioned on the transmission layer 520c and may cover the lateral side of the partition wall 265. The low-refractive index layer 240 may not be formed on the upper side of the partition wall 265.

A shape of the low-refractive index layer 240 in the first opening 267a, the second opening 267b, and the third opening 267c will now be described with reference to FIG. 6 to FIG. 9. FIG. 6 shows a shape of an opening in a plan view, and FIG. 7 shows a cross-sectional shape of an opening. FIG. 8 shows a planar shape of a low-refractive index layer formed in an opening, and FIG. 9 shows a cross-sectional shape of a low-refractive index layer formed in an opening.

As shown in FIG. 6, the planar shape of the opening may substantially be rectangular. As shown in FIG. 7, the cross-sectional shape of the opening may have a form in which the lateral side of the partition wall has a steep slant.

As shown in FIG. 8 and FIG. 9, the low-refractive index layer may be formed on a ground side in the opening and the lateral side SS of the partition wall. This may be because the ink material for forming a low-refractive index layer may be filled on an edge of the partition wall and the lateral side SS with strong surface tension by a capillary phenomenon. By this, a gradient of the low-refractive index layer positioned on the lateral side SS of the partition wall may be lowered than the gradient of the lateral side of the partition wall.

By forming the low-refractive index layer 240 by the inkjet printing scheme, the low-refractive index layer 240 may be positioned on the lateral side of the partition wall 265. Therefore, light input to the lateral side of the partition wall 265 may be totally reflected by the low-refractive index layer 240 and may be discharged to the front, and the efficiency of emitting light to the front of the display device may be increased.

Figure 10:
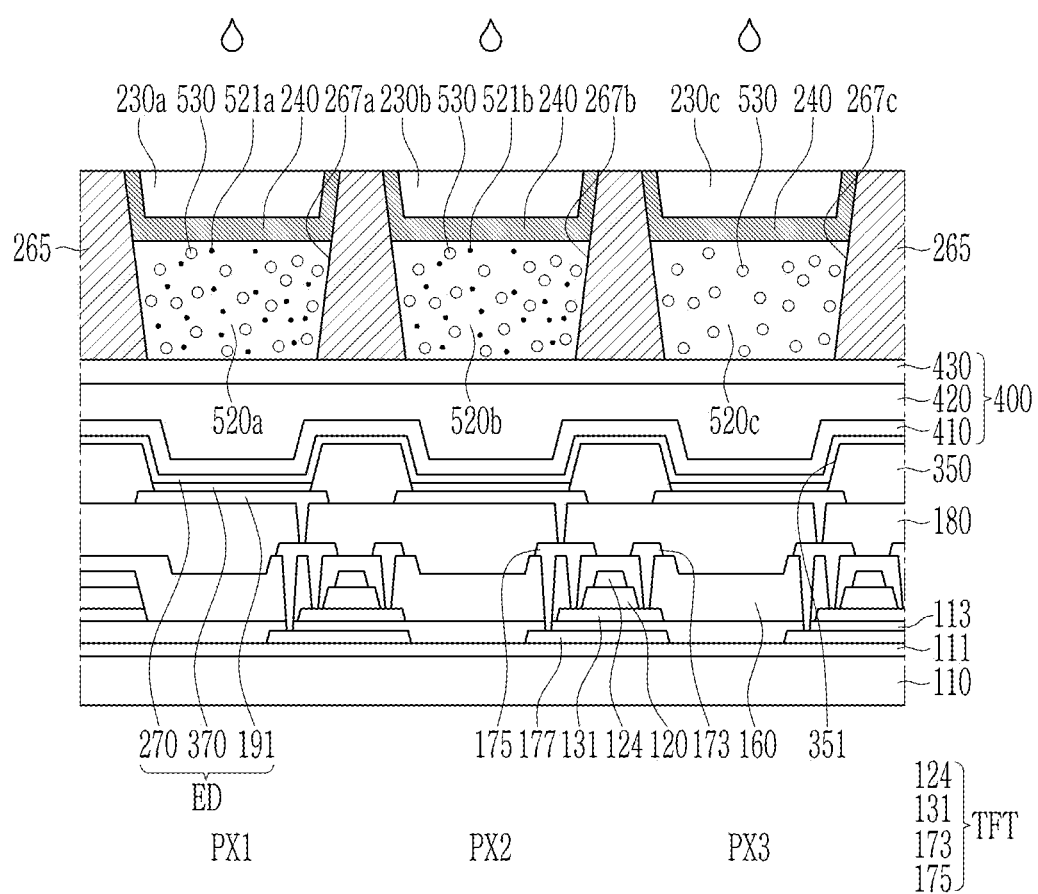

As shown in FIG. 10, by performing the inkjet printing process, the first color filter 230a may be formed in the first opening 267a, the second color filter 230b may be formed in the second opening 267b, and the third color filter 230c may be formed in the third opening 267c.

Different ink materials may be dropped into the first opening 267a, the second opening 267b, and the third opening 267c. The inkjet printing process may be performed by using an inkjet printing device including nozzles, and the ink materials may be dropped in the openings 267a, 267b, and 267c while moving the nozzles.

The first color filter 230a may be positioned on the low-refractive index layer 240 in the first opening 267a. The bottom surface and the lateral side of the first color filter 230a may contact the low-refractive index layer 240. The first color filter 230a may overlap the first color converting layer 520a. The first color filter 230a may be made with an ink material for transmitting light with a first wavelength and absorbing light with other wavelengths.

The second color filter 230b may be positioned on the low-refractive index layer 240 in the second opening 267b. The bottom surface and the lateral side of the second color filter 230b may contact the low-refractive index layer 240. The second color filter 230b may overlap the second color converting layer 520b. The second color filter 230b may be made with an ink material for transmitting light with a second wavelength and absorbing light with other wavelengths.

The third color filter 230c may be positioned on the low-refractive index layer 240 in the third opening 267c. The bottom surface and the lateral side of the third color filter 230c may contact the low-refractive index layer 240. The third color filter 230c may overlap the transmission layer 520c. The third color filter 230c may be made with an ink material for transmitting light with a third wavelength and absorbing light with other wavelengths.

The first color filter 230a, the second color filter 230b, and the third color filter 230c may not overlap each other. The first color filter 230a, the second color filter 230b, and the third color filter 230c may not overlap the partition wall 265. The first color filter 230a, the second color filter 230b, and the third color filter 230c may not be formed on the upper side of the partition wall 265. The first color filter 230a may be positioned in the first opening 267a and may not be positioned on the outside of the first opening 267a. The second color filter 230b may be positioned in the second opening 267b and may not be positioned on the outside of the second opening 267b. The third color filter 230c may be positioned in the third opening 267c and may not be positioned on the outside of the third opening 267c. The partition wall 265 may be positioned between the first color filter 230a and the second color filter 230b, between the second color filter 230b and the third color filter 230c, and between the third color filter 230c and the first color filter 230a. The partition wall 265 may function as a light blocking member. The low-refractive index layer 240 may be positioned between the lateral side of the first color filter 230a and the lateral side of the partition wall 265. The low-refractive index layer 240 may be positioned between the lateral side of the second color filter 230b and the lateral side of the partition wall 265. The low-refractive index layer 240 may be positioned between the lateral side of the third color filter 230c and the lateral side of the partition wall 265.

The low-refractive index layer 240, the first color filter 230a, the second color filter 230b, and the third color filter 230c may be formed in the openings 267a, 267b, and 267c not by using the photo process but by using the inkjet printing process. Hence, a material cost and a processing cost for forming the low-refractive index layer 240, the first color filter 230a, the second color filter 230b, and the third color filter 230c may be reduced. For example, in case that the inkjet printing process is performed with 33% of the area ratio of the openings 267a, 267b, and 267c and 67% of the area ratio of the partition wall 265, the material cost of the low-refractive index layer 240 may be reduced by about 66%, and the material cost of the color filters 230a, 230b, and 230c may be reduced by about 90%.

By not allowing the first color filter 230a, the second color filter 230b, and the third color filter 230c to overlap each other, no steps among the adjacent pixels PX1, PX2, and PX3 may be generated, and the upper side of the display device according to an embodiment may be made flat.

Figure 11:
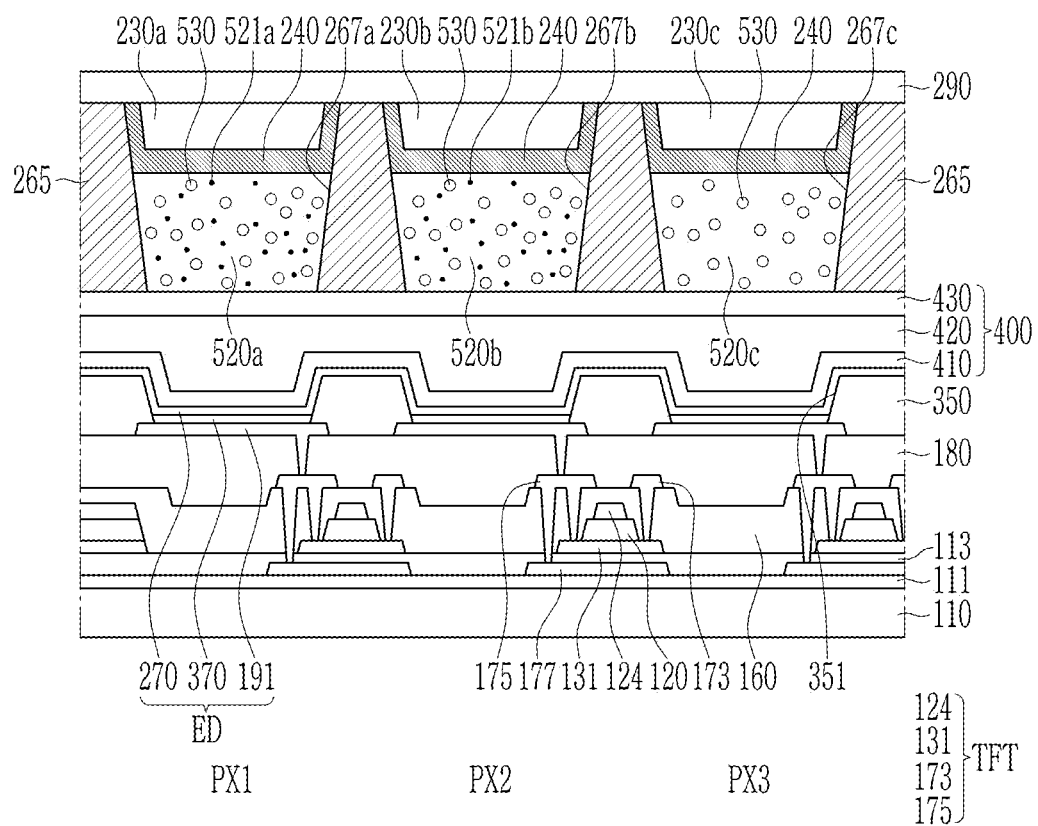

As shown in FIG. 11, an overcoat layer 290 may be formed on the first color filter 230a, the second color filter 230b, the third color filter 230c, and the partition wall 265. The overcoat layer 290 may be formed by using the inorganic insulating material or the organic insulating material, and the overcoat layer 290 may be generally formed on the substrate 110. The overcoat layer 290 may generally cover the first color filter 230a, the second color filter 230b, the third color filter 230c, and the partition wall 265 and may flatten the same. The first color filter 230a, the second color filter 230b, and the third color filter 230c positioned below the overcoat layer 290 may not overlap each other so flatness of the upper side of the overcoat layer 290 may increase. Therefore, generation of a diffused reflection on the surface of the display device may be prevented.

A display device and a manufacturing method thereof according to an embodiment will now be described with reference to FIG. 12.

The display device and the manufacturing method thereof according to an embodiment described with reference to FIG. 12 may correspond to the display device and the manufacturing method thereof according to embodiments described with reference to FIG. 1 to FIG. 11, so redundant description may be omitted. A first capping layer and a second capping layer may be further formed in an embodiment, which may be different from the previous embodiment and will now be described.

Figure 12:
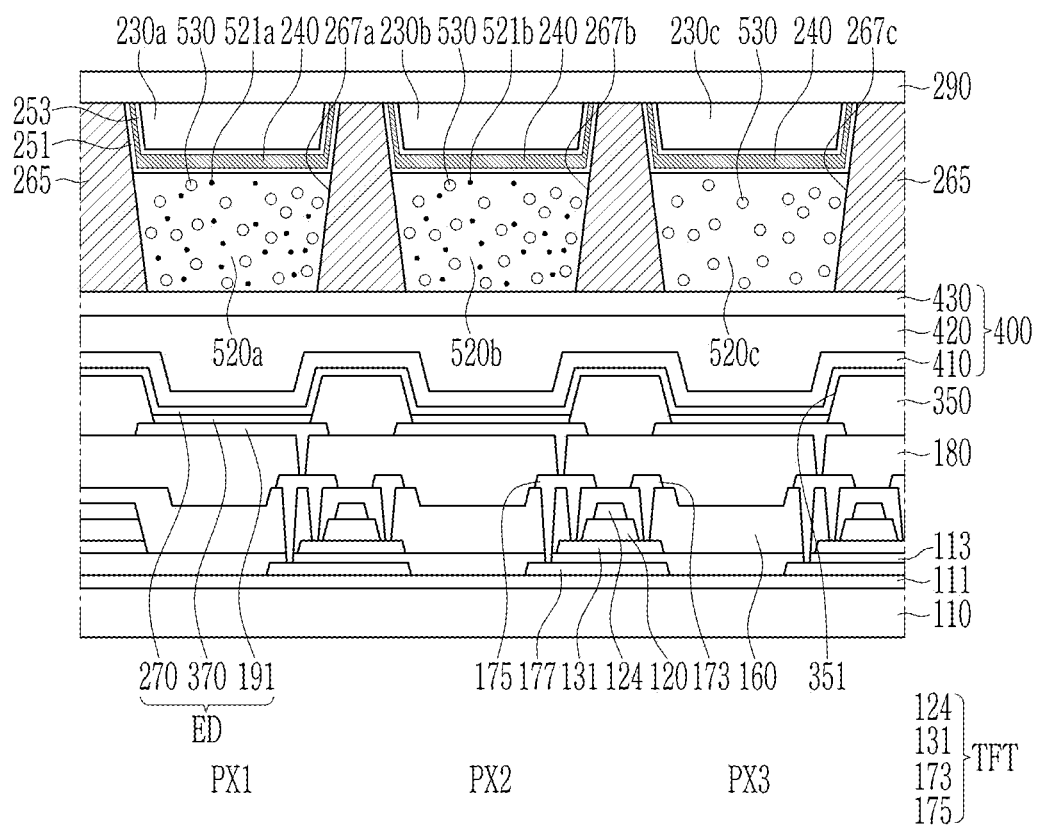
FIG. 12 schematically shows a cross-sectional view of a display device according to an embodiment.

FIG. 12 schematically shows a cross-sectional view of a display device according to an embodiment.

The display device may include, in a like way according to a previous embodiment, a substrate 110, a transistor TFT positioned on the substrate 110, and a light-emitting device ED connected to the transistor TFT. An encapsulation layer 400 may be positioned on the light-emitting device ED, and a partition wall 265 including a first opening 267a, a second opening 267b, and a third opening 267c may be positioned on the encapsulation layer 400. The first color converting layer 520a, the low-refractive index layer 240, and the first color filter 230a may be positioned in the first opening 267a. The second color converting layer 520b, the low-refractive index layer 240, and the second color filter 230b may be positioned in the second opening 267b. The transmission layer 520c, the low-refractive index layer 240, and the third color filter 230c may be positioned in the third opening 267c.

In a previous embodiment, the low-refractive index layer 240 may be positioned on the first color converting layer 520a, the second color converting layer 520b, and the transmission layer 520c, and in an embodiment, the first capping layer 251 may be positioned on the first color converting layer 520a, the second color converting layer 520b, and the transmission layer 520c, and the low-refractive index layer 240 may be positioned on the first capping layer 251. The first capping layer 251 may be positioned in the first opening 267a, the second opening 267b, and the third opening 267c, and may not be positioned on the upper side of the partition wall 265.

The first color converting layer 520a, the second color converting layer 520b, and the transmission layer 520c may be formed, the inorganic insulating material such as a silicon nitride (SiNx), a silicon oxide (SiOx), or a silicon oxynitride (SiOxNy) may be deposited, and may be patterned to thus form the first capping layer 251. The first capping layer 251 may have a single-layered or multi-layered structure of the material.

A first capping layer 251 may be positioned between the first color converting layer 520a and the low-refractive index layer 240 in the first opening 267a. The first capping layer 251 may be positioned on the lateral side of the partition wall 265. The low-refractive index layer 240 may not contact the partition wall 265 in the first opening 267a. The first capping layer 251 may be positioned between the low-refractive index layer 240 and the partition wall 265.

The first capping layer 251 may be positioned between the second color converting layer 520b and the low-refractive index layer 240 in the second opening 267b. The first capping layer 251 may be positioned on the lateral side of the partition wall 265. The low-refractive index layer 240 may not contact the partition wall 265 in the second opening 267b. The first capping layer 251 may be positioned between the low-refractive index layer 240 and the partition wall 265.

The first capping layer 251 may be positioned between the transmission layer 520c and the low-refractive index layer 240 in the third opening 267c. The first capping layer 251 may be positioned on the lateral side of the partition wall 265. The low-refractive index layer 240 may not contact the partition wall 265 in the third opening 267c. The first capping layer 251 may be positioned between the low-refractive index layer 240 and the partition wall 265.

In a previous embodiment, the first color filter 230a, the second color filter 230b, and the third color filter 230c may be positioned on the low-refractive index layer 240, and in an embodiment, the second capping layer 253 may be positioned on the low-refractive index layer 240, and the first color filter 230a, the second color filter 230b, and the third color filter 230c may be positioned on the second capping layer 253. The second capping layer 253 may be positioned in the first opening 267a, the second opening 267b, and the third opening 267c, and may not be positioned on the upper side of the partition wall 265.

In case that the low-refractive index layer 240 is formed, the inorganic insulating material such as a silicon nitride (SiNx), a silicon oxide (SiOx), and/or a silicon oxynitride (SiOxNy) may be deposited, and may be patterned to thus form the second capping layer 253. The second capping layer 253 may have a single-layered or multi-layered structure of the material.

The second capping layer 253 may be positioned between the low-refractive index layer 240 and the first color filter 230a in the first opening 267a. The second capping layer 253 may contact the bottom surface and the lateral side of the first color filter 230a.

The second capping layer 253 may be positioned between the low-refractive index layer 240 and the second color filter 230b in the second opening 267b. The second capping layer 253 may contact the bottom surface and the lateral side of the second color filter 230b.

The second capping layer 253 may be positioned between the low-refractive index layer 240 and the third color filter 230c in the third opening 267c. The second capping layer 253 may contact the bottom surface and the lateral side of the third color filter 230c.

The first capping layer 251 may be positioned on a lower portion of the low-refractive index layer 240, and the second capping layer 253 may be positioned on an upper portion of the low-refractive index layer 240. The low-refractive index layer 240 may be protected by the first capping layer 251 and the second capping layer 253.

A display device according to an embodiment will now be described with reference to FIG. 13.

The display device and the manufacturing method thereof according to an embodiment described with reference to FIG. 13 may correspond to the display device and the manufacturing method thereof according to an embodiment described with reference to FIG. 12, so redundant description may be omitted. The first capping layer and the second capping layer may be generally formed in an embodiment, which may be different from the previous embodiment and will now be described.

Figure 13:
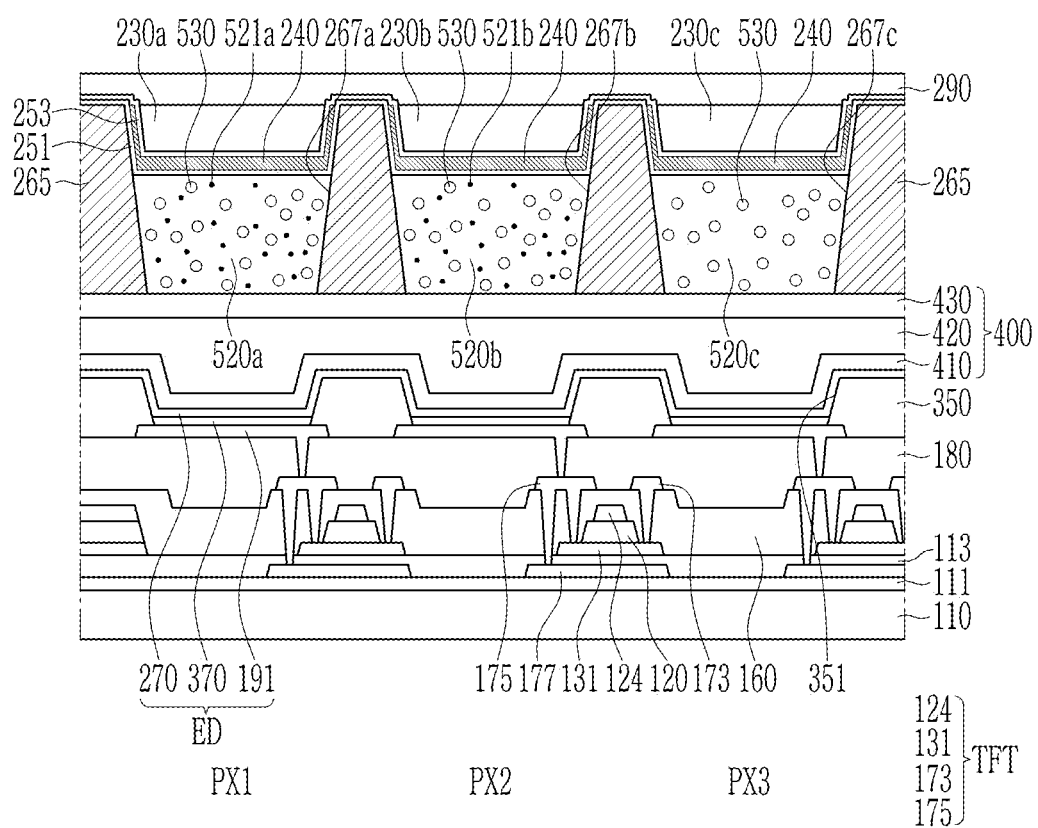
FIG. 13 schematically shows a cross-sectional view of a display device according to an embodiment.

FIG. 13 schematically shows a cross-sectional view of a display device according to an embodiment.

The display device may include, in a like way according to the previous embodiment, a substrate 110, a transistor TFT positioned on the substrate 110, and a light-emitting device ED connected to the transistor TFT. An encapsulation layer 400 may be positioned on the light-emitting device ED, and a partition wall 265 including a first opening 267a, a second opening 267b, and a third opening 267c may be positioned on the encapsulation layer 400. The first color converting layer 520a, the first capping layer 251, the low-refractive index layer 240, the second capping layer 253, and the first color filter 230a may be positioned in the first opening 267a. The second color converting layer 520b, the first capping layer 251, the low-refractive index layer 240, the second capping layer 253, and the second color filter 230b may be positioned in the second opening 267b. The transmission layer 520c, the first capping layer 251, the low-refractive index layer 240, the second capping layer 253, and the third color filter 230c may be positioned in the third opening 267c.

In a previous embodiment, the first capping layer 251 may be patterned so that the first capping layer 251 may not be positioned on the upper side of the partition wall 265, and in an embodiment, the first capping layer 251 may be generally formed. For example, the process for patterning the first capping layer 251 may not be additionally performed. The first capping layer 251 may also be positioned on the upper side of the partition wall 265.

In a previous embodiment, the second capping layer 253 may be patterned so that the second capping layer 253 may not be positioned on the upper side of the partition wall 265, and in an embodiment, the second capping layer 253 may be generally formed. For example, the process for patterning the second capping layer 253 may not be additionally performed. The second capping layer 253 may also be positioned on the upper side of the partition wall 265.

The first capping layer 251 and the second capping layer 253 may be positioned on the upper side of the partition wall 265. The low-refractive index layer 240 may be positioned between the first capping layer 251 and the second capping layer 253 in the first opening 267a, the second opening 267b, and the third opening 267c. The second capping layer 253 may be positioned on the first capping layer 251 on the upper side of the partition wall 265. The first capping layer 251 and the second capping layer 253 may be made of a same material or different materials. The thicknesses of the first capping layer 251 and the second capping layer 253 may be respectively about 4000 Å, and an influence to the flatness of the upper side of the overcoat layer 290 may not be large.

Therefore, in case that the first capping layer 251 and the second capping layer 253 may be formed on the upper side of the partition wall 265, the upper side of the overcoat layer 290 may be made flat. In the display device according to an embodiment, the process for patterning the first capping layer 251 and the second capping layer 253 may not be additionally performed so the processing time and cost may be reduced.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A display device comprising:
a substrate;
a transistor disposed on the substrate;
a light-emitting device electrically connected to the transistor;
an encapsulation layer disposed on the light-emitting device;
a partition wall disposed on the encapsulation layer, and including an opening overlapping the light-emitting device; and
a color converting layer, a low-refractive index layer, and a color filter sequentially stacked on each other in the opening, wherein
the low-refractive index layer has a first portion interposed between the color converting layer and the color filter, and a second portion connected to the first portion and interposed between a lateral surface of the partition wall and the color filter,
wherein the low-refractive index layer is not disposed on an upper side of the partition wall.

2. The display device of claim 1, wherein the partition wall includes:
a first opening overlapping a light-emitting device of a first pixel;
a second opening overlapping a light-emitting device of a second pixel; and
a third opening overlapping a light-emitting device of a third pixel.

3. The display device of claim 2, wherein
a first color converting layer, the low-refractive index layer, and a first color filter are disposed in the first opening,
a second color converting layer, the low-refractive index layer, and a second color filter are disposed in the second opening, and
a transmission layer, the low-refractive index layer, and a third color filter are disposed in the third opening.

4. The display device of claim 3, wherein
the low-refractive index layer is disposed on the first color converting layer, the second color converting layer, and the transmission layer, and
the low-refractive index layer is disposed on the lateral surface of the partition wall.

5. The display device of claim 3, wherein the first color filter, the second color filter, and the third color filter do not overlap each other.

6. The display device of claim 5, wherein the first color filter, the second color filter, and the third color filter are not disposed on an upper side of the partition wall.

7. The display device of claim 3, further comprising:
a first capping layer and a second capping layer that are disposed in the first opening, the second opening, and the third opening, wherein
the first capping layer is disposed between the first color converting layer and the low-refractive index layer, between the second color converting layer and the low-refractive index layer, and between the transmission layer and the low-refractive index layer, and
the second capping layer is disposed between the low-refractive index layer and the first color filter, between the low-refractive index layer and the second color filter, and between the low-refractive index layer and the third color filter.

8. The display device of claim 7, wherein the first capping layer and the second capping layer are disposed on an upper side of the partition wall.

9. The display device of claim 3, further comprising:
an overcoat layer disposed on the first color filter, the second color filter, the third color filter, and the partition wall.

10. A method for manufacturing a display device comprising:
forming a transistor and a light-emitting device electrically connected to the transistor on a substrate;
forming an encapsulation layer on the light-emitting device;
forming a partition wall on the encapsulation layer;
forming an opening overlapping the light-emitting device by patterning the partition wall;
forming a color converting layer in the opening;
forming a low-refractive index layer in the opening; and
forming a color filter in the opening, wherein
the low-refractive index layer has a first portion interposed between the color converting layer and the color filter, and a second portion connected to the first portion and interposed between a lateral surface of the partition wall and the color filter,
wherein the low-refractive index layer is not disposed on an upper side of the partition wall.

11. The method of claim 10, wherein
the forming of the color converting layer, the forming of the low-refractive index layer, and the forming of the color filter are performed by using an inkjet printing process.

12. The method of claim 10, wherein the patterning of the partition wall includes forming:
a first opening overlapping a light-emitting device of a first pixel,
a second opening overlapping a light-emitting device of a second pixel, and
a third opening overlapping a light-emitting device of a third pixel.

13. The method of claim 12, wherein the forming of the color converting layer includes, by dropping different ink materials into the first opening, the second opening, and the third opening:
forming a first color converting layer in the first opening,
forming a second color converting layer in the second opening, and
forming a transmission layer in the third opening.

14. The method of claim 13, wherein
the forming of the low-refractive index layer includes by dropping a same ink material into the first opening, the second opening, and the third opening, forming the low-refractive index layer on the first color converting layer, the second color converting layer, and the transmission layer.

15. The method of claim 14, wherein
the low-refractive index layer is disposed on the lateral surface of the partition wall.

16. The method of claim 14, wherein
the forming of the color filter includes, by dropping different ink materials in the first opening, the second opening, and the third opening:
forming a first color filter in the first opening,
forming a second color filter in the second opening, and
forming a third color filter in the third opening, and
the first color filter, the second color filter, and the third color filter are disposed on the low-refractive index layer.

17. The method of claim 16, wherein
the first color filter, the second color filter, and the third color filter do not overlap each other, and
the first color filter, the second color filter, and the third color filter are not disposed on an upper side of the partition wall.

18. The method of claim 16, further comprising:
before the forming of the low-refractive index layer, forming a first capping layer on the first color converting layer, the second color converting layer, and the transmission layer; and
after the forming of the low-refractive index layer, forming a second capping layer on the low-refractive index layer.

19. The method of claim 16, further comprising:
forming an overcoat layer on the first color filter, the second color filter, the third color filter, and the partition wall.

* * * * *